United States Patent
Hamberger et al.

(10) Patent No.: US 8,896,306 B2
(45) Date of Patent: Nov. 25, 2014

(54) METHOD AND APPARATUS FOR DETECTING A MAGNETIC CHARACTERISTIC VARIABLE IN A CORE

(75) Inventors: Peter Hamberger, Kirchschlag bei Linz (AT); Albert Leikermoser, Salzburg (AT)

(73) Assignee: Siemens Aktiengesellschaft, Munich (DE)

( * ) Notice: Subject to any disclaimer, the term of this patent is extended or adjusted under 35 U.S.C. 154(b) by 87 days.

(21) Appl. No.: 13/640,372

(22) PCT Filed: Apr. 14, 2010

(86) PCT No.: PCT/EP2010/054857
§ 371 (c)(1),
(2), (4) Date: Oct. 10, 2012

(87) PCT Pub. No.: WO2011/127969
PCT Pub. Date: Oct. 20, 2011

(65) Prior Publication Data
US 2013/0049751 A1 Feb. 28, 2013

(51) Int. Cl.
*G01R 33/04* (2006.01)
*G01R 33/00* (2006.01)
*H01F 3/12* (2006.01)
*H01F 27/40* (2006.01)
*G01R 33/07* (2006.01)

(52) U.S. Cl.
CPC .......... *G01R 33/072* (2013.01); *G01R 33/0023* (2013.01); *H01F 3/12* (2013.01); *H01F 27/402* (2013.01)
USPC ...................................................... 324/253

(58) Field of Classification Search
CPC ...................................................... G01R 33/04
USPC ........................................................... 324/253
See application file for complete search history.

(56) References Cited

U.S. PATENT DOCUMENTS

| 3,863,109 | A | | 1/1975 | Emanuel et al. | |
|---|---|---|---|---|---|
| 4,177,418 | A | * | 12/1979 | Brueckner et al. | 323/250 |
| 2001/0045785 | A1 | * | 11/2001 | Chen et al. | 310/104 |
| 2007/0159284 | A1 | | 7/2007 | Chang | |

FOREIGN PATENT DOCUMENTS

| CN | 101681716 A | 3/2010 |
|---|---|---|
| DE | 102006037003 A1 | 2/2008 |
| JP | 57043406 A | 3/1982 |
| KR | 1020010020798 A | 3/2001 |
| KR | 20050035251 A | 4/2005 |
| KR | 1020050044155 A | 5/2005 |
| SU | 435513 A1 | 7/1974 |
| WO | WO 0143267 A1 | 6/2001 |
| WO | WO 2008151661 A1 | 12/2008 |

* cited by examiner

Primary Examiner — Reena Aurora

(57) ABSTRACT

A technique is provided for detecting a magnetic characteristic variable in particular the magnetic field strength in a section of a core permeated by a magnetic flux. A portion of the magnetic flux is branched off from the core and passed via a magnetic shunt branch, in which at least one non-ferromagnetic gap is formed. A shunt part is disposed in the shunt branch, wherein the magnetic material of the shunt part is not saturated. At least one section of the shunt part is wound with at least one sensor coil in which the branched-off portion of the magnetic flux generates a sensor signal by induction. The magnetic characteristic variable is determined from the branched-off portion of the magnetic flux or a variable derived therefrom using a sensor and evaluation device to which the sensor signal is fed.

19 Claims, 2 Drawing Sheets

METHOD AND APPARATUS FOR DETECTING A MAGNETIC CHARACTERISTIC VARIABLE IN A CORE

CROSS REFERENCE TO RELATED APPLICATIONS

This application is the US National Stage of International Application No. PCT/EP2010/054857, filed Apr. 14, 2010 and claims the benefit thereof. All of the applications are incorporated by reference herein in their entirety.

TECHNICAL FIELD

The invention relates to a method and an apparatus for detecting a magnetic characteristic variable, in particular the magnetic field strength in a section of a core permeated by a magnetic flux.

PRIOR ART

In electrical transformers of the kind used in power distribution systems, because of the increased use of power electronic components such as are used, for example, in conjunction with electric drives or reactive power compensation equipment, a current component may be produced which must be regarded as DC in respect of the system. Although this direct current or "DC component" usually accounts for only a few thousandths of the transformer's rated current, it produces in the core of the transformer a unidirectional magnetic flux which is superimposed on the alternating flux.

So-called geomagnetically induced currents (GIC) may also produce a unidirectional flux component in a transformer core.

Modern core materials have a very high magnetic permeability and cores are produced in step-lap lamination processes. As a result, transformer cores have very high permeability and usually the magnetic material of a transformer core is subject to high utilization, which makes the transformer particularly sensitive to constant fields.

Even moderate DC ampere-turns can cause such a saturation asymmetry in the B-H curve, so that the flux density in each half-period comes close to the saturation flux density of the core material. As a result, the magnetizing current is no longer sinusoidal, but distorted. The temperature in the core and in the electrical winding increases. During operation, increased noise generation occurs, which is particularly disadvantageous if a transformer is to be installed close to a residential area.

To reduce operating noise for a transformer, DE 40 21 860 C 2 proposes noise measurement on the transformer. Depending on the transformer noise, a DC generator injects a compensating current into a compensation winding of the transformer, so that the operating noise is reduced. However, the noise measurement is complex and fault-prone.

In the case of a power transformer, the unidirectional flux component could basically also be determined by current transformers by measuring the current flowing in the primary windings and secondary windings and filtering out from the measurement signal those components of the even harmonics which correlate with the magnetic unidirectional flux in the core. However, the disadvantage of this is that the current transformers must be installed in a region of higher voltage potential, which is costly in terms of the high insulation requirement.

Another possibility would be to filter out the constant field component by determining the spectral content of even harmonics in the voltage signals. However, this amplitude of the even harmonics is only in the region of thousandths of the system frequency fundamental, which makes measurement data processing complex.

Moreover, particular requirements are posed in respect of such a measurement system, as a power transformer is always designed for a very long operating life with very low maintenance. Self-evidently, a measurement system for detecting a DC component should have minimal effect on the design of both the magnetic core and the electrical winding and other mechanical structural components.

PCT/EP2007/055728 describes a transformer with unidirectional flux compensation, wherein on the basis of a magnetic field measurement a compensating current is predefined such that the direct (zero frequency) component is reduced. The magnetic field is measured by means of a sensor coil disposed on the transformer core. Although the coil is reliable, because of the weakness of the sensor signal the processing of the measurement signal requires very sophisticated hardware components for signal conditioning and also highly complex signal processing algorithms.

However, there is currently no known satisfactory all-round solution for detecting a direct component in a core.

SUMMARY OF THE INVENTION

The object of the present invention is to create an approach enabling asymmetrical core saturation to be detected in the simplest possible manner.

This object is achieved for a method with the features of claim 1 and for an apparatus with the features of claim 10. Advantageous embodiments of the invention are defined in the respective dependent claims.

The invention proposes a novel way of detecting the physical variable that causes the asymmetrical saturation of the magnetic material. According to the invention, a sensor device is used which operates as a kind of "magnetic bypass": by means of a ferromagnetic shunt part, a portion of the main magnetic flux is branched off at the transformer core and fed downstream again. From this branched-off flux component bypassing the core, the magnetic field strength in the core section bypassed by the shunt branch is determined either directly, or indirectly from a physical variable derived therefrom. This detection of the magnetic field strength, hereinafter also referred to as magnetic excitation, has a number of advantages. On the one hand, the signal complexity for determining a constant field component in a magnetically soft core is reduced, since in the case of incipient saturation in the transformer core the leakage flux component is known to increase. This means that for every half-period in which the magnetic material of the core (measured objects) in the region bypassed by the shunt part (sensor) goes into saturation because of the asymmetry, the flux component passing through the shunt branch increases relative to the main flux in the measured object because of the in principle much higher magnetic saturation limit of the shunt part. In other words, the invention takes cognizance of the advantage of the technical effect that, to detect a magnetic characteristic variable in a section of the core, it is advantageous if the shunt branch, even in the case of heavy magnetic saturation in the region of the section of the core (measured object) bypassed by the shunt part (sensor), itself still shows no magnetic saturation effects of any kind and its "magnetic resistance", i.e. essentially the rms permeability of the magnetic shunt, is largely unaffected by the saturation situation of the measured object and remains constant. This effect can be achieved by different means.

In a preferred embodiment of the inventive method, the branched-off magnetic flux is fed via at least one non-ferromagnetic gap, hereinafter referred to as an "air gap" for the sake of clarity. This makes it possible to increase the magnetic saturation limit while also producing a linearizing effect on the rms permeability of the entire shunt branch and therefore on the measuring accuracy. As a result, even in the case of powerful magnetic saturation of the core, the magnetic material of the shunt part still remains free of magnetic saturation effects and this branched-off magnetic flux component is directly proportional to the magnetic excitation of the monitored region of the measured object.

In another preferred embodiment it can be provided that the shunt branch via which the branched-off parts of the magnetic flux are passed has an rms permeability lower than the permeability of the magnetically soft core material. This likewise ensures that even in the case of heavy magnetic saturation of the core, the shunt part is still free from magnetic saturation effects and its magnetic flux is directly proportional to the magnetic excitation of the monitored region of the measured object. In another further development of this embodiment it can be provided that the branched-off magnetic flux is fed via a non-ferromagnetic gap, thereby making the shunt branch even less sensitive to saturation effects.

The magnetic shunt part is advantageously provided with a measuring device for measuring the branched-off magnetic flux in the shunt branch. This can be implemented in a technically simple manner by a sensor coil which is disposed on the shunt part. A sensor signal is induced in said sensor coil if the branched-off magnetic flux portion permeating the sensor coil changes over time. However, a different magnetic field detector such as a Hall sensor can also be used.

For the purpose of evaluation, the sensor signal is fed to an evaluation device. The evaluation device can be used, for example, to determine the direct component of a magnetic flux in the core of a transformer from the sensor signal.

It is advantageous for the evaluation if a low-frequency fundamental component is first eliminated using a notch filter and the sensor signal is then digitized, wherein sampling takes place at equidistant time instants using a sampling frequency corresponding to an integral multiple of the transformer's system frequency.

It can be advantageous for the signal processing unit if digital signal values are added to digital signal values lagging the system frequency by half a period in each case.

It is advantageous here if signal components with twice the system frequency are filtered out from the digital signal values using a bandpass filter and the filtered-out signal values undergo Fourier transformation.

The object is also achieved by providing an apparatus having a magnetic shunt part which carries a magnetic flux portion branched-off from the core, wherein the magnetic material of the shunt part is not saturated, and having a sensor and evaluation device which is designed to determine the magnetic field strength in the core section from this branched-off portion of the magnetic flux or a variable derived therefrom.

An advantageous embodiment of the invention in terms of reliability consists in that one or more sections of the magnetic shunt part are wound with at least one sensor coil in which a sensor signal is produced by induction and from which the direct component is determined by means of an evaluation device. No active structural components are required, and the sensor coil is not subject to drift of any kind.

A preferred embodiment can be designed such that the shunt part is U-shaped and a sensor coil is disposed on each leg. Interference can be reduced by appropriate wiring of the two sensor coils.

In order to extract from the sensor signal in the simplest possible manner the even harmonics which represent the unidirectional flux component in the core, it is advantageous if digitization of the sensor signal is performed in the evaluation device, wherein sampling takes place at equidistant time instants using a sampling frequency corresponding to an integral multiple of the system frequency of the transformer.

A per se known notch filter can be advantageously used to suppress the system frequency signal components present in the measurement signal of the sensor coil. As a result, the system frequency signal components can be largely eliminated. A notch filter can be produced in both digital and analog form.

A particularly preferred application of the method according to the invention and/or the apparatus according to the invention is the suppression of operating noise in power transformers. The invention makes it possible for a constant magnetic field in the core of the transformer to be detected over a long operating period in a technically simple and at the same time reliable manner. In conjunction with a compensation winding additionally mounted on the transformer and a device for generating a compensating current, the unidirectional flux causing the asymmetry can be nullified. The present invention allows simple and operationally reliable detection of the relevant magnetic characteristic variable in the core, a prerequisite for effective compensation.

The invention also provides a simple means of recording the magnetic flux in the transformer core, so that load states occurring during operation can be logged and plotted (monitoring).

The measuring principle on which the invention is based can also conceivably be advantageously used in the manufacture of magnetically soft cores for electrical machines. In the manufacture of transformers of the type used in electricity supply networks, qualitative characteristics of the laminated magnetic core can be detected and monitored during production.

Another possible application of the present invention can be in a mobile or fixed measuring instrument for magnetic characteristic variables.

BRIEF DESCRIPTION OF THE DRAWINGS

For further explanation of the invention, reference will be made in the following section of the description to the accompanying drawings which illustrate other advantageous embodiments, details and developments of the invention.

EXPLANATION OF THE INVENTION

Figure 1:
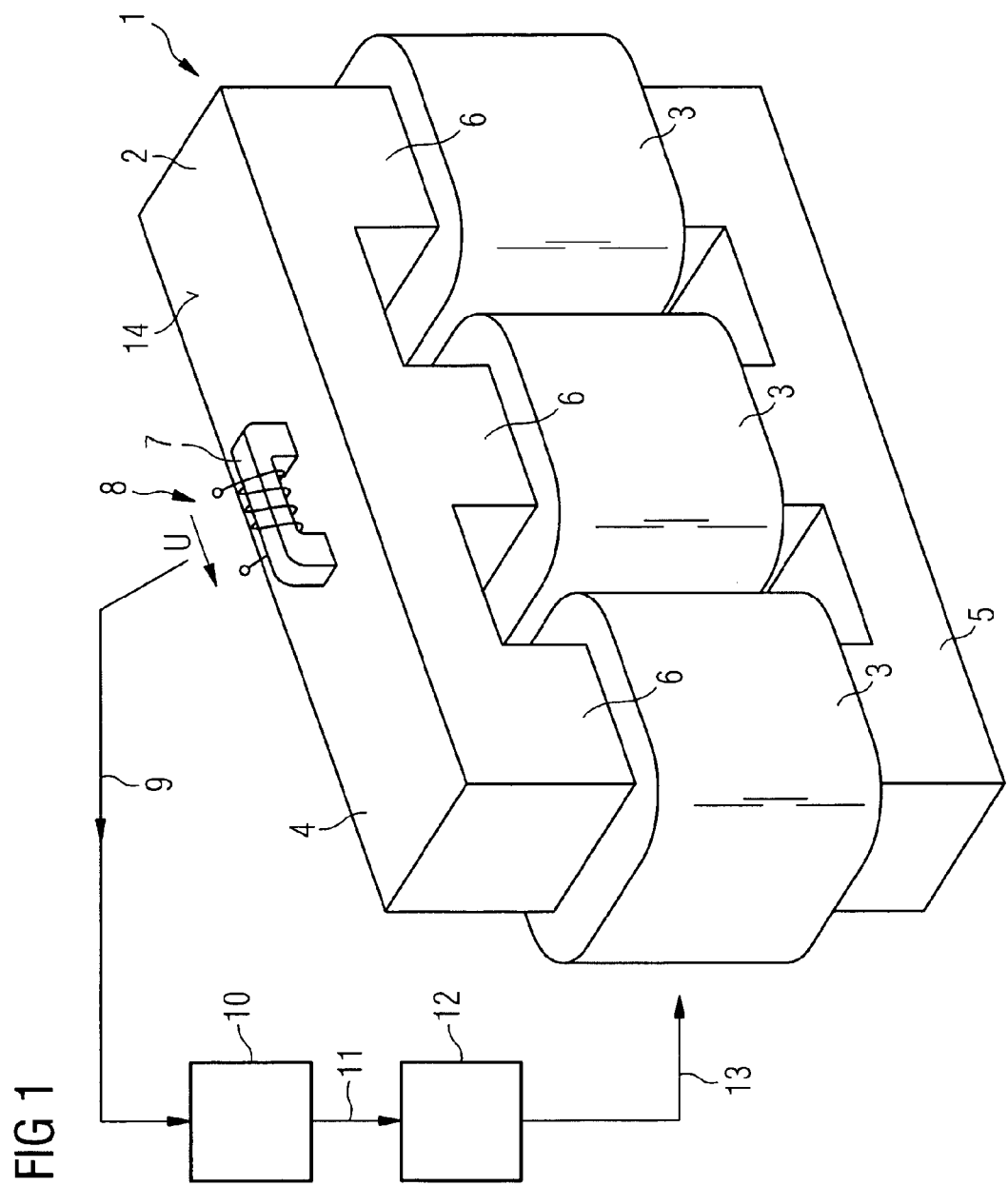
FIG. 1 is a schematic illustration of a transformer showing a possible arrangement of the inventive apparatus for detecting a unidirectional flux component in the core and a block diagram of the signal processing unit.

FIG. 1 shows a schematic perspective view of a transformer 1 provided with an apparatus according to the invention for detecting a magnetic direct component. Detection of the direct component is a prerequisite for effectively counteracting the unidirectional flux component (DC component) and the accompanying asymmetrical saturation degree of the magnetic material, thereby reducing noise and local heating occurring during operation.

The transformer 1 possesses a core 2 having three legs 6. Each of these legs 6 carries a winding arrangement 3. The three legs 6 are of normal construction, being connected to an upper yoke 4 at the top and a lower yoke 5 at the bottom. According to the invention, a so-called shunt part 7 is disposed on an exposed section of the surface 14 of the upper part of the yoke 4 in direct contact therewith or at a distance therefrom. The purpose of this shunt part 7 is to detect the unidirectional flux component in the core 2.

The shunt part 7, the operation of which will be explained in greater detail below, supplies a sensor signal 9 to an evaluation device 10. The evaluation device 10 generates a control signal 11 which is fed to a downstream compensating current generating device 12. The compensating current generating device 12 generates as a function of the applied control signal 11 a compensating current 13 which is injected into the compensation winding 20 (FIG. 2) of the transformer 1. The magnitude and direction of the compensating current 13 are predefined such that it counteracts or rather compensates the direct component 15 of the magnetic flux in the core 2 of the transformer 1.

Figure 2:
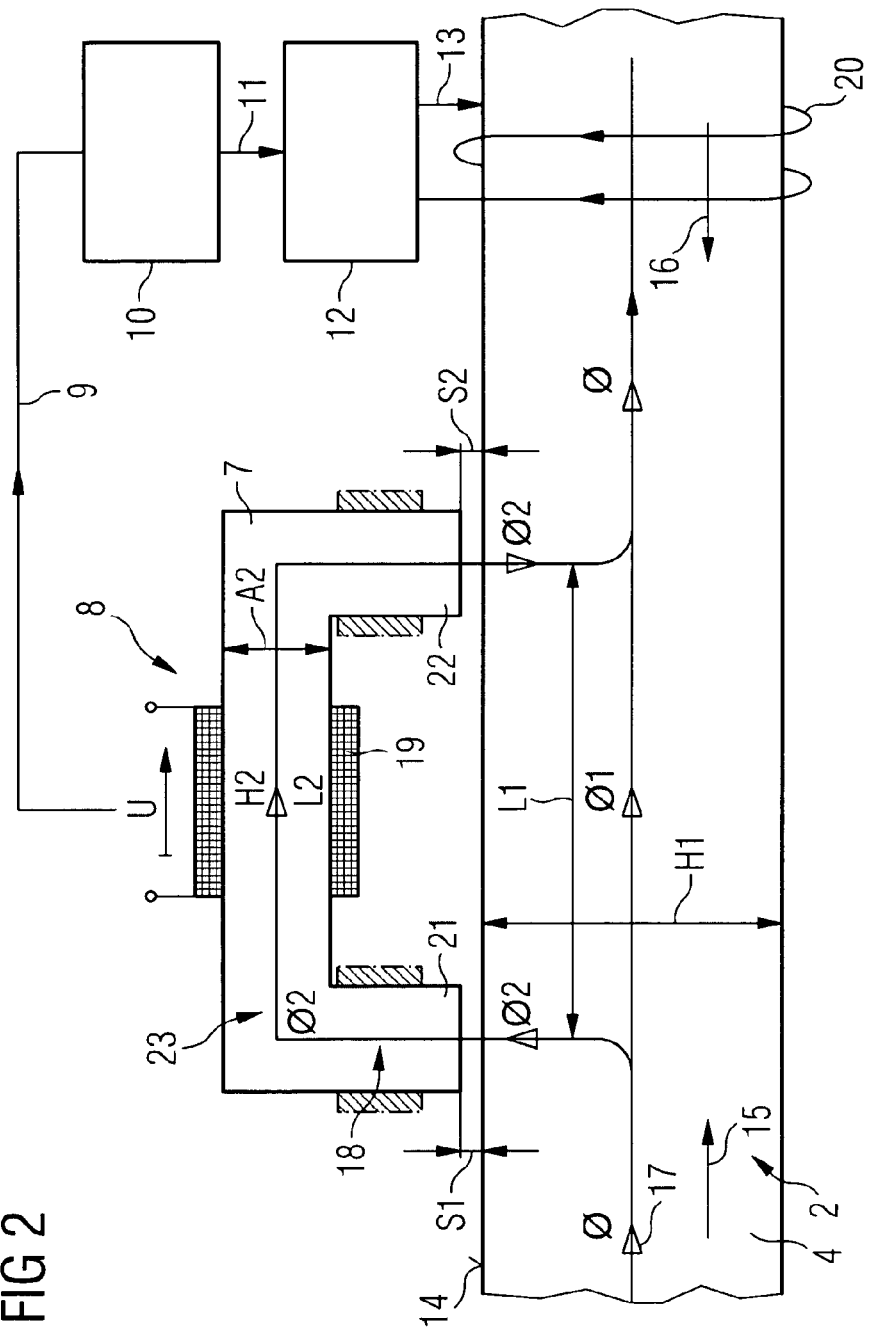
FIG. 2 is a schematic drawing showing an enlarged representation of the shunt part which acts as a magnetic shunt by bypassing the main magnetic flux direction.

FIG. 2 shows the shunt part 7 in an enlarged representation. The shunt part 7 is disposed approximately parallel to a section on the upper yoke 4 of the transformer 2. It carries a fraction of the magnetic flux 17 passing through the upper yoke section 4 of the transformer 1. In the case of saturation, the leakage flux increases and the flux component passing through the shunt therefore also increases As FIG. 2 shows, with the aid of the shunt part 7 a portion 18 ($\Phi 2$) of the magnetic flux is branched off from the main flux of the electrical machine and enters a "magnetic bypass". At the branching point, the path of said branched-off magnetic flux 18 ($\Phi 2$) first passes via an air gap S1 into a first leg 21 of the shunt part 7. The branched-off flux then passes via a middle section to a second leg 22. From there the branched-off portion of flux $\Phi 2$ returns to the upper yoke section 4 via the air gap S2. After reunification with the magnetic flux $\Phi 1$ of the bypassed section L1, the main flux $\Phi$ is resumed.

In FIG. 2, for each of these magnetic flux components $\Phi 1$ and $\Phi 2$, the associated magnetic excitation is denoted by H1 and H2, the path in the iron by L1 and L2, and the respective cross-sectional area by A1 and A2. Identified by the arrow 15 is the direct component of the magnetic flux which is superimposed on the main alternating flux 17.

By applying Ampere's law it can be shown that the magnetic flux $\Phi$ in the sensor, i.e. in the shunt branch 23, behaves directly proportionally to the magnetic excitation H in the region of the measured object bypassed by the sensor.

$$\Phi_2 = [(\mu_0 \cdot L_1 \cdot A_2)/S'] \cdot H_1$$

where $$S' := [S + (L_2/\mu_{R2})]$$

with the total air gap length S=S1+S2 and with the relative permeability of the shunt part $\mu_{R2}$.

As electrical transformers and other electrical machines are usually operated from sinusoidal voltage sources having low source impedance, on the basis of Faraday's law the waveform of the first derivative of the magnetic flux $\Phi$ (directly proportional to the source voltage) and directly following therefrom also the integral thereof, i.e. the magnetic flux $\Phi$ itself and therefore also the magnetic flux density or induction B, can be assumed to be largely sinusoidal. When magnetic saturation effects occur, because of the strongly decreasing permeability of the magnetic material, the magnetic excitation H must be significantly increased in order to reach the required magnetic flux density B. This also explains why magnetic saturation effects appear much more strongly in the magnetic excitation H (and therefore also in the first derivative thereof over time) compared to the flux density B. Therefore, detectors which produce a measurement signal proportional to the magnetic excitation H or to its first derivative dH/dt are advantageous. Moreover, in addition to the above described application, this method of measurement can also be used for constructing measuring instruments for measuring the magnetic excitation H obtaining in a part under test or also in conjunction with a magnetic flux density measurement for determining the magnetization curve of the magnetic material used in a part under test.

The magnetic shunt branch 23 can be attached with minimal complexity to any part of a core section, e.g. to the yoke or a leg. The design of the transformer core, electrical winding or other mechanical components is unaffected by said shunt branch. The novel principle enables the unidirectional flux component to be detected without integration and therefore without drift. The measurement principle according to the invention can therefore also be advantageously used for long-term recording (monitoring). The manufacturing costs are low.

Because of the described proportionality between magnetic excitation H in the part under test and the magnetic flux $\Phi$ in the sensor, the voltage induced in the sensor then corresponds in the part under test to the first derivative of the magnetic excitation over time (dH/dt) and can provide a long-term stable picture of the direct current magnetic field components in a transformer or in the magnetic circuit of an electric machine over its entire service life using suitable evaluation methods.

Particularly advantageous is the use of two sensor coils (denoted by dash-dotted lines in FIG. 2) which are disposed on respective legs 21, 22 and connected electrically in series and are disposed along the magnetic shunt branch 23 such that, on the one hand, the effect of external fields and/or leakage fields is compensated, while the effects of the magnetic flux $\Phi$ caused by the part under test in the sensor are added together in the voltage measurement signal. This can be achieved, for example, by symmetrical mounting of the two sensor coils to the respective side legs of a U-shaped sensor.

By inserting a so-called Hall sensor in the magnetic shunt circuit 23 of the sensor, e.g. in the air gap or in one of the air gaps thereof, because of the above mentioned proportionality between magnetic excitation H in the part under test (measured object) and the magnetic flux and/or magnetic induction B in the sensor, a measurement system for directly measuring the magnetic excitation H in the region of the part under test bypassed by the sensor can be implemented. Of course, instead of a Hall sensor, any other equivalent measurement method delivering an output signal proportional to the induction B can also be used for this purpose. The essential requirement is that the sensor principle converts the magnetic excitation H in the part under test (measured object) into a magnetic flux proportional thereto and therefore also into a flux density (induction) B proportional thereto in the sensor.

If at the same time the magnetic flux density (induction) B in the part under test is measured, in conjunction with the above described measurement of the magnetic excitation H obtaining in the part under test, a measurement system for determining the magnetic properties of the ferromagnetic materials used in the part under test can be implemented.

The branched-off flux component 18 (Φ2) permeates the sensor coil 19 which is wound around a middle section of the C-shaped shunt part 7 linking the two legs 21, 22 or is implemented in the form of two series-connected part-coils disposed on the two respective sensor legs. During operation of the transformer 1 a sensor voltage 8 (also denoted by U in FIG. 2) is induced in said sensor coil 19. This sensor voltage 8 is fed as a sensor signal 9 via an electric line to an evaluation device 10.

In the evaluation device 10, this sensor signal is first processed by amplifying it and filtering it through a lowpass filter and a bandpass filter. The first overtone, i.e. the second harmonic, is well known for analyzing the sensor signal 9 for a direct component (DC component). Because of the "half-wave asymmetry", the magnetizing current must have even harmonics. These even components are also to be found in the sensor voltage of the measurement coil 19. The present invention utilizes this effect by appropriate signal processing of the induced voltage in the measurement coil 19.

The signal processing of the evaluation device 10 will now be explained in greater detail:

To suppress the system frequency signal components dominant in the sensor signal, a so-called notch filter is used which suppresses said system frequency signal components to the largest possible extent. The notch filter can be realized in both analog and digital technology.

The sensor signal is then digitized using a conventional analog/digital converter. The signal is sampled at a sampling frequency exactly corresponding to an even multiple of the system frequency. The sampling frequency is generated by means of an analog or digital PLL in conjunction with a controlled oscillator.

Additionally or alternatively to the above notch filter, in the evaluation device the current digital signal value is then added to a digital signal value lagging the system frequency by exactly half a period.

As a result, the evaluation device 10 supplies a control signal 11 which is functionally related to the magnetic constant field 15 of the transformer 1 that is to be determined.

A gap S1 and S2 is provided between the end faces of the two legs 21, 22 and a surface 14 of the core 2 in each case. Each gap S1, S2 is implemented such that each presents a comparatively high resistance to the magnetic flux 18. This non-ferromagnetic implementation of the gap S1, S2 ensures that in those half waves of B in which the magnetic material of the core 2 is already going into saturation, the ferromagnetic alloy of the shunt part 7 is not yet saturated. In other words, the invention makes use of the property that when magnetic saturation effects occur in the measured object the relative permeability reduces, thereby increasing the magnetic resistance. This results in an increase in the magnetic leakage field, as the magnetic resistance of the leakage field remains unchanged, i.e. in the case of incipient magnetic saturation a further increase in the magnetic flux is proportionally carried less by the iron core of the transformer and therefore an increased leakage flux must occur. If a constant field component is present in the core of the transformer, this "displacement effect" of the proportional leakage field increase only occurs in the half-period in which the unidirectional magnetic flux and the alternating flux are additively combined.

The shunt part 7 can be made from stacked sheets of a ferromagnetic alloy or on a ferrite basis and mechanically designed such that the shunt part 7 remains free of magnetic saturation effects even in the case of heavy magnetic saturation of the part under test 2 (measured object). The two legs 21, 22 can also be cross-sectionally stepped to accommodate two sensor measurement coils. In order to protect the individual conductors of the measurement coil from damage, a carrier made of an insulator can be provided between the measurement coil(s) and the sheet stack. The measurement coil(s) themselves can consist of conventional enameled round or flat wire.

In the exemplary embodiment described above, the shunt part 7 is U-shaped. It is self-evident that the shunt part 7 can also have any other geometrical shape, e.g. rounded, C-shaped, or circular.

The arrangement of the shunt part 7 on the upper yoke 4 has been selected by way of example. Basically, any exposed area carrying the main flux on the surface 14 of the core 2 is a possibility here. The shunt part 7 can therefore also be disposed on the leg 6 or on the lower part of the yoke 5.

The measurement principle explained above using the example of a transformer core can also be applied to a measuring instrument that can be used, for example, in quality control for the production of laminated cores for electrical machines.

LIST OF REFERENCE CHARACTERS USED 1 transformer
2 core
3 electric winding
4 upper yoke
5 lower yoke
6 leg
7 shunt part
8 sensor device (detector)
9 sensor signal
10 evaluation device
11 control signal
12 compensating current generating device
13 compensating current
14 surface of the core
15 direct component
16 compensating flux
17 main flux
18 branched-off portion of the magnetic flux
19 sensor coil
20 compensation winding
21 leg
22 leg
23 shunt branch
S1 first air gap
S2 second air gap
A1 cross-sectional area in the shunt part 7
A1 cross-sectional area in the yoke 4
L1 magnetic path length in the yoke 4
L2 magnetic path length in the shunt part 7

The invention claimed is:

1. A method for detecting a magnetic characteristic variable in a section of a core permeated by a magnetic flux, the method comprising:
   branching off a portion of the magnetic flux from the core and passing the branched off portion via a magnetic shunt branch, in which at least one non-ferromagnetic gap is formed,
   disposing a shunt part in the shunt branch, wherein the magnetic material of the shunt part is not saturated,
   winding at least one section of the shunt part with at least one sensor coil in which the branched-off portion of the magnetic flux generates a sensor signal by induction, and determining the magnetic characteristic variable is determined from the branched-off portion of the magnetic flux or a variable derived therefrom using a sensor and evaluation device to which the sensor signal is fed.

2. The method as claimed in claim 1, wherein the shunt branch via which the branched-off portion of the magnetic flux is passed has an rms permeability which is lower than the permeability of the core.

3. The method as claimed in claim 1, comprising determining a direct component of the magnetic flux from the sensor signal using the evaluation unit.

4. The method as claimed in claim 3, wherein said core is a core of a transformer, wherein in the evaluation device a system frequency fundamental component is eliminated using a notch filter, and digitization of the sensor signal is carried out, wherein sampling is performed at equidistant time instants using a sampling frequency corresponding to an integral multiple of a system frequency of the transformer.

5. The method as claimed in claim 4, comprising adding digital signal values to a digital signal value lagging the system frequency by half a period in each case.

6. The method as claimed in claim 4, comprising filtering signal components with twice the system frequency out of the digital signal values using a bandpass filter, and implementing a Fourier transformation on the filtered-out signal values.

7. The method as claimed in claim 1, wherein the magnetic characteristic variable is the magnetic field strength in said section of the core.

8. An apparatus for detecting a magnetic characteristic variable in a section of a core permeated by a magnetic flux, wherein a portion of the magnetic flux is branched off from the core and passed via a magnetic shunt branch, the apparatus comprising:
  a magnetic shunt part which is disposed in the shunt branch and carries the portion of the magnetic flux branched-off from the core, wherein at least one non-ferromagnetic gap is formed in the shunt branch, so that the magnetic material of the shunt part is not saturated; and wherein at least one section of the shunt part is wound with at least one sensor coil in which the branched-off portion of the magnetic flux generates a sensor signal by induction, and
  a sensor and evaluation device to which the sensor signal is fed, and which is configured to determine the magnetic characteristic variable from the branched-off portion of the magnetic flux, or from a variable derived therefrom.

9. The apparatus as claimed in claim 8, wherein the shunt branch in which the branched-off portion of the magnetic flux is passed the rms permeability is lower than the permeability of the core.

10. The apparatus as claimed in claim 8, wherein the evaluation unit is configured to determine a direct component of the magnetic flux from the sensor signal supplied.

11. The apparatus as claimed in claim 8, wherein the magnetic shunt part is U-shaped and has two legs on which a sensor coil is disposed in each case which are electrically connected in series and spatially disposed in the shunt branch such that the effect of external fields is compensated, while the induced electrical voltage produced by the branched-off portion of the magnetic flux is added.

12. The apparatus as claimed in claim 8, wherein the evaluation device has a notch filter which eliminates a system frequency fundamental component from the sensor signal.

13. The apparatus as claimed in claim 12, wherein the evaluation device is configured to carry out digitization of the sensor signal, wherein sampling is performed at equidistant time instants using a sampling frequency corresponding to an integral multiple of the system frequency.

14. The apparatus as claimed in claim 12, wherein the evaluation device is configured such that digital signal values are in each case added to a digital signal value lagging the system frequency by half a period.

15. The apparatus as claimed in claim 12, wherein the evaluation device is equipped with a bandpass filter in order to filter out signal components having twice the system frequency from the signal values.

16. The apparatus as claimed in claim 12, wherein the evaluation device is equipped with a computing device by means of which a Fourier transform can be calculated from the filtered-out signal values.

17. The apparatus as claimed in claim 8, wherein the shunt part is formed from a stack of C-shaped ferromagnetic sheets.

18. The apparatus as claimed in claim 17, wherein the C-shaped sheets have first legs and second legs and the arrangement relative to the core is selected such that each of these legs forms a gap between an end facing the core and the surface of the core.

19. A transformer incorporated in an electricity supply system, comprising:
  a core, and
  an apparatus according to claim 8 for counteracting a unidirectional flux component in the core of the transformer and/or record the operating state of the transformer.

* * * * *